(12) United States Patent
Hassner et al.

(10) Patent No.: US 7,134,066 B2
(45) Date of Patent: Nov. 7, 2006

(54) GENERALIZED PARITY STRIPE DATA STORAGE ARRAY

(75) Inventors: Martin Aureliano Hassner, Mountain View, CA (US); Steven R. Hetzler, Los Altos, CA (US); Tetsuya Tamura, Kanagawa (JP); Barry Marshall Trager, Yorktown Heights, NY (US); Shmuel Winograd, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 519 days.

(21) Appl. No.: 10/689,814

(22) Filed: Oct. 20, 2003

(65) Prior Publication Data
US 2005/0086575 A1    Apr. 21, 2005

(51) Int. Cl.
*G11C 29/52* (2006.01)
*G11C 29/42* (2006.01)
(52) U.S. Cl. .................. 714/766; 714/770; 714/804
(58) Field of Classification Search ............. 714/766, 714/770, 804
See application file for complete search history.

(56) References Cited

U.S. PATENT DOCUMENTS

| | | | |
|---|---|---|---|
| 3,831,144 A * | 8/1974 | En ............................ | 714/804 |
| 6,167,552 A * | 12/2000 | Gagnon et al. ............. | 714/760 |
| 6,675,318 B1 * | 1/2004 | Lee ............................ | 714/770 |
| 2003/0167439 A1 * | 9/2003 | Talagala ..................... | 714/770 |
| 2004/0078642 A1 * | 4/2004 | Nanda ........................ | 714/6 |
| 2005/0015700 A1 * | 1/2005 | Hetzler et al. ............. | 714/766 |

OTHER PUBLICATIONS

McCorkle, Mike; The International Electrotechnical Commission Standard for exponent prefixes in IT; Presented at the THIC Meeting at the National Center forAtmospheric Research, Boulder, CO Jun. 29-30, 2004; cover sheet and pp. 1-2; URL http://www.thic.org/pdf/Jun04/fujifilm.mmcorkle.pdf.*

* cited by examiner

*Primary Examiner*—R. Stephen Dildine
(74) *Attorney, Agent, or Firm*—Joseph P. Curtin, L.L.C (57) ABSTRACT

The Hamming distance of an array of storage devices is increased by generating a parity check matrix based on column equations that are formed using an orthogonal parity code and includes a higher-order multiplier that changes each column. The higher order multiplier is selected to generate a finite basic field of a predetermined number of elements. The array has M rows and N columns, such that M is greater than or equal to three and N is greater than or equal to three. Row 1 through row M−2 of the array each have n−p data storage devices and p parity storage devices. Row M−1 of the array has n−(p+1) data storage devices and (p+1) parity storage devices. Lastly, row M of the array has N parity storage devices.

8 Claims, 9 Drawing Sheets

| $P_{15}$ | $D_{21}$ | $P_{23}$ |
| --- | --- | --- |
| $D_{14}$ | $P_{25}$ | $P_{31}$ |
| $D_{13}$ | $P_{24}$ | $P_{35}$ |
| $D_{12}$ | $D_{23}$ | $P_{34}$ |
| $D_{11}$ | $D_{22}$ | $P_{33}$ |

*FIG. 8*

GENERALIZED PARITY STRIPE DATA STORAGE ARRAY

BACKGROUND OF THE INVENTION

1. Field of the Invention

The present invention relates to storage systems. In particular, the present invention relates to a system and a method that utilizes a modified parity check matrix for increasing the number of storage-unit failures that the array can tolerate without loss of data stored on the array.

2. Description of the Related Art

The increased storage capacity of Hard Disk Drives (HDDs) and HDD-based storage systems are being used for storing large quantities of data, such as reference data and backup data, in a rare write, infrequent read access (near-line storage) configuration. Another exemplary application storing a large amount of data is the Picture Archive and Communication System (PACS) with which about 6600 hospitals in the U.S. yearly generate nearly 1 PB of medical imaging data. Yet another exemplary application storing a large amount of data is an e-mail system, such as Microsoft Hotmail e-mail system, which is purportedly approaching a PB in size. Accordingly, the increased storage capacity places stringent failure tolerance requirements on such HDD-based storage systems.

A known system uses low-cost HDDs that are configured in a RAID 5 blade as the basic building block. Multiple blades are then configured as a further array, such as in a RAID 1 or RAID 5 configuration, for enhancing the failure tolerance. Such an arrangement has the appearance of being a product of two parity codes, yet implementation as a nested array significantly reduces failure tolerance.

Figure 1:
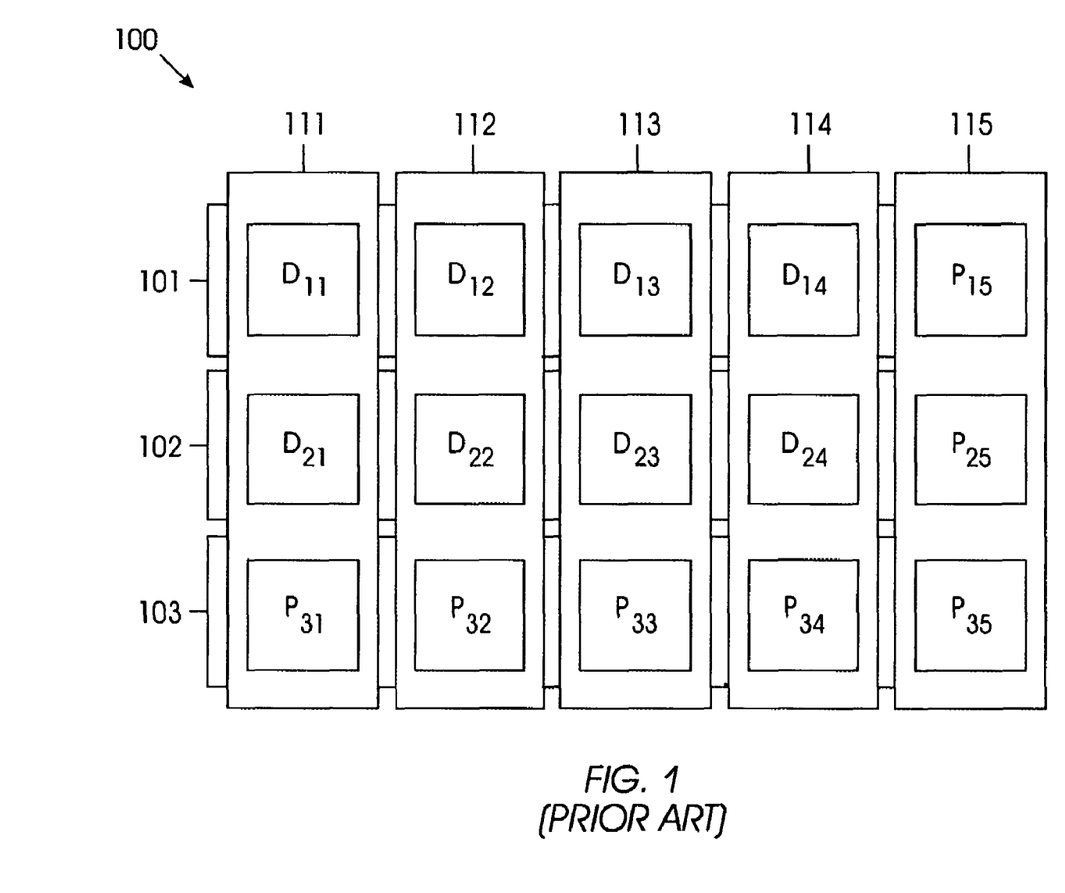
FIG. 1 shows an exemplary array of HDDs configured as a conventional product of two parity codes.

For example, FIG. 1 shows an exemplary array 100 of fifteen HDDs configured as three blades. Each blade contains five HDDs in a 4+P RAID 5 configuration. The blades are further configured as a 2+P RAID 5. Accordingly, blade 101 includes HDDs $D_{11}$, $D_{12}$, $D_{13}$, $D_{14}$ and $P_{15}$, in which HDDs $D_{11}$, $D_{12}$, $D_{13}$ and $D_{14}$ store data and HDD $P_{15}$ stores parity information for blade 101. Blade 102 includes HDDs $D_{21}$, $D_{22}$, $D_{23}$, $D_{24}$ and $P_{25}$, in which HDDs $D_{21}$, $D_{22}$, $D_{23}$, $D_{24}$ store data and HDD $P_{25}$ stores parity information for blade 102. Blade 103 includes HDDs $P_{31}$, $P_{32}$, $P_{33}$, $P_{34}$ and $P_{35}$, in which HDDs $P_{31}$, $P_{32}$, $P_{33}$, and $P_{34}$ respectively store parity information for columns 111–114 and HDD $P_{35}$ stores parity information for blade 103 (and for column 115). As indicated in FIGS. 1–5, 6 and 8, the first digit of an HDD designator represents the blade or row number of the HDD and the second digit represents the column number of the HDD.

The general arrangement of FIG. 1 is commonly referred to as a product code because it is the product of two parity codes. The minimum distance of a product code is the product of the individual distances or, in this case, 4. In a product code, many reconstructions must be performed iteratively.

Figure 2:
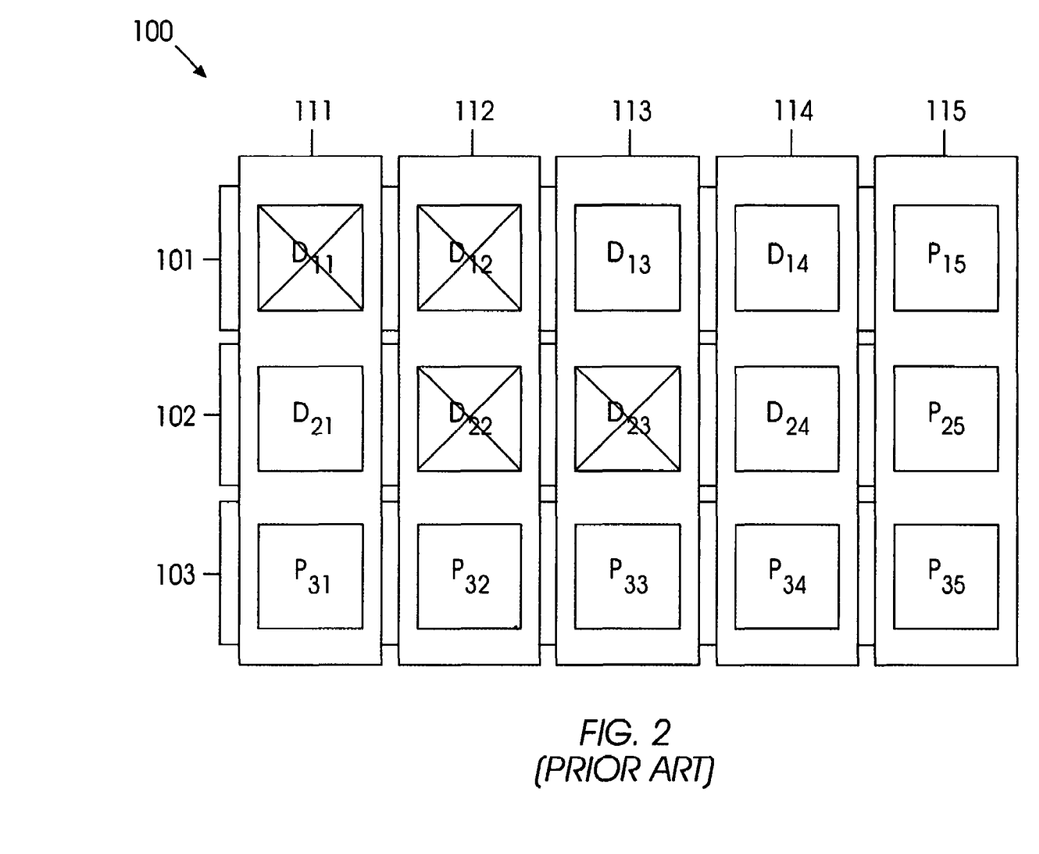
FIG. 2 depicts the exemplary array of FIG. 1 having four HDDs failures that are correctable as the product of two parity codes.

FIG. 2 depicts exemplary array 100 of FIG. 1 having four HDDs failures that are correctable as the product of two parity codes. In FIG. 2, HDDs $D_{11}$, $D_{12}$, $D_{22}$ and $D_{23}$ have failed, as indicated by an X through each failed HDD. While a nested array configured as a RAID5(RAID5) is also distance 4, in general, such a configuration cannot recover from the particular failure arrangement shown in FIG. 2. In the case of the nested array, Blades 101 and 102 are both unable to correct the two failures with the inner RAID, and the outer RAID cannot recover from two blade failures. In contrast, a product code can recover from the failure arrangement shown in FIG. 2 because the HDDs are not viewed as virtual HDDs. HDD $D_{11}$ is recovered by the column 111 parity, and HDD $D_{23}$ is recovered by the column 113 parity. Following these two operations, blades 101 and 102 each have only a single failure, and can be recovered by the respective row parity. While stronger than a nested array, the product code is still only distance 4.

Figure 3:
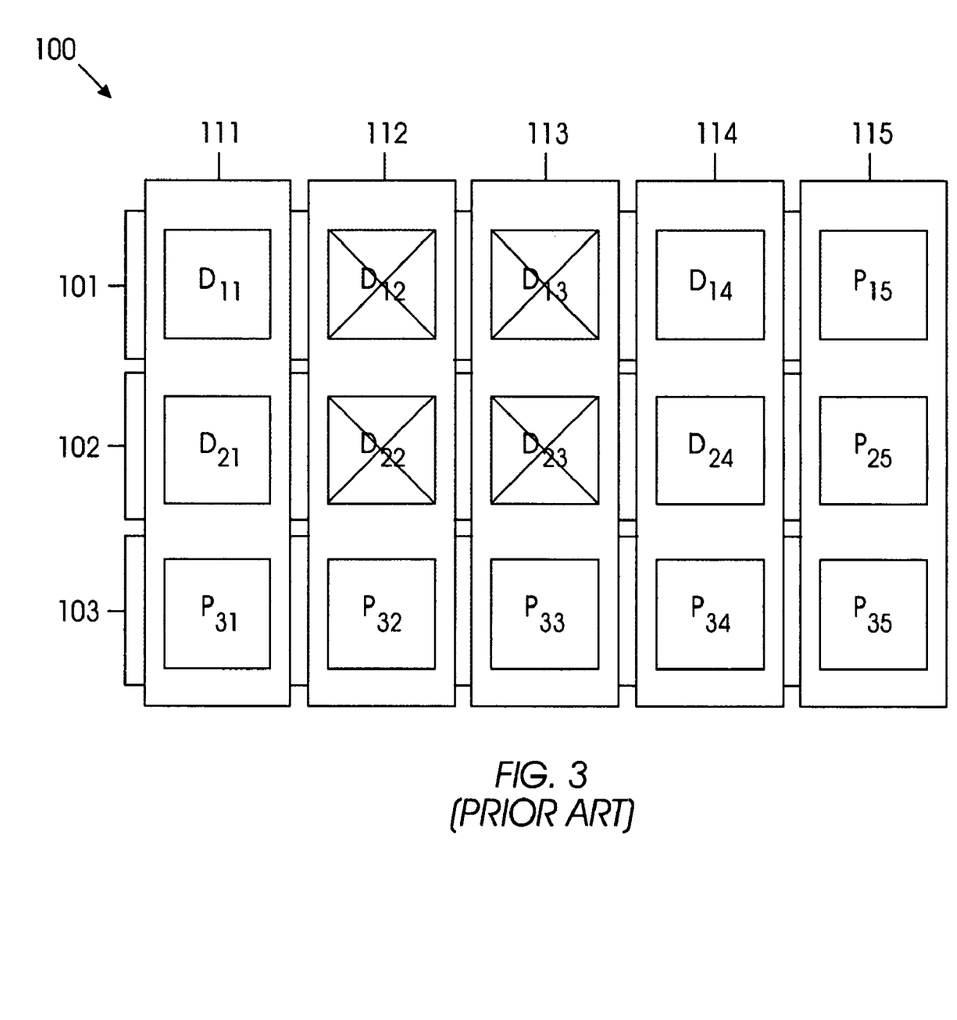
FIG. 3 shows the exemplary array of FIG. 1 having four failures that are not correctable as the product of two parity codes.

In general, product codes of this type are called products of parity stripes, and are known. There are, however, many failure combinations that product codes cannot correct. For example, FIG. 3 depicts exemplary array 100 of FIG. 1 in which HDDs $D_{12}$, $D_{13}$, $D_{22}$ and $D_{23}$ have failed, as indicated by an X through the HDD. This particular set of disk failures is not correctable because the product of two parity codes does not provide a linearly independent set of parity equations.

What is needed is a technique for improving the fault tolerance of an array of HDDs beyond to the capability of conventional product code techniques.

BRIEF SUMMARY OF THE INVENTION

The present invention provides a technique for improving the fault tolerance of an array of HDDs beyond to the capability of conventional product code techniques.

The advantages of the present invention are provides by a storage system having a plurality of storage devices arranged in an array having M rows and N columns, such that M is greater than or equal to three and N is greater than or equal to three. The array has a Hamming distance of d when P of the storage devices are configured as parity storage devices and (M×N)−P of the storage devices are configured as data storage devices. When P+1 of the storage devices are configured as parity storage devices and (M×N)−(P+1) of the storage devices are configured as data storage devices, the array has a Hamming distance of d+1.

Another aspect of the present invention provides a method of increasing the Hamming distance of an array of storage devices having M rows and N columns, such that M is greater than or equal to three and N is greater than or equal to three. The M×N array is formed by forming a first predetermined number of rows of the array to each have a second predetermined number of data storage devices and a third predetermined number of parity storage devices, such that the third predetermined number is greater than or equal to one. M minus the first predetermined number of rows of the array are formed to have N parity storage devices. The Hamming distance of the array is increased by increasing a number of parity devices in the M×N array by changing a selected data storage device in one of the first predetermined number of rows to be a parity storage device.

Yet another aspect of the present invention provides a method of recovering data stored on a failed storage device in an array of storage devices having M rows and N columns, such that M is greater than or equal to three and N is greater than or equal to three. A first predetermined number of rows of the array each have a second predetermined number of data storage devices and a third predetermined number of parity storage devices. The third predetermined number is greater than or equal to one. One row of the array has the second predetermined number minus one data storage devices and the third predetermined number plus one parity storage devices. A fourth predetermined number of rows of the array have N parity storage devices. The first predetermined number plus the fourth predetermined number plus one equals M, and the second predetermined number plus the third predetermined number equals N. According to the invention, a plurality of row equations is formed that are based on parity. A plurality of column equations is formed that are based on an orthogonal parity code and includes a higher-order multiplier that changes each column. The higher order multiplier is selected to generate a finite basic field of a predetermined number of elements. The data stored on the failed storage device is recovered based on the row equations and the column equations. When the third predetermined number equals one, the plurality of row equations is based on simple parity.

Still another aspect of the present invention provides a method of recovering data stored on a failed storage device in an array of storage devices having M rows and N columns, such that M is greater than or equal to three and N is greater than or equal to three. A first predetermined number of rows of the array have a second predetermined number of data storage devices and a third predetermined number of parity storage devices. The third predetermined number being greater than or equal to one. A fourth predetermined number of rows of the array has N parity storage devices. According to the present invention, a plurality of row equations is formed that are based on parity. A plurality of column equations is formed that are based on an orthogonal parity code and includes a higher-order multiplier that changes each column. The higher order multiplier is selected to generate a finite basic field of N of elements. The data stored on the failed storage device is recovered based on the row equations and the column equations. When the third predetermined number equals one, the plurality of row equations is based on simple parity.

BRIEF DESCRIPTION OF THE DRAWINGS

The present invention is illustrated by way of example and not by limitation in the accompanying figures in which like reference numerals indicate similar elements and in which.

DETAILED DESCRIPTION OF THE INVENTION

The present invention significantly increases the failure tolerance of HDD arrays with only a minimal impact of additional I/O operations that are required for updating. Consequently, the present invention allows for a higher failure tolerance to be achieved at a reasonable efficiency using a fewer number of HDDs than are used by conventional product code arrangements.

The present invention modifies a parity check matrix by using roots of unity such that the constraint equations for certain error patterns become independent. As a result, the number of minimal weight error patterns can be reduced at no additional overhead cost, but with a slight increase in arithmetic complexity of the encoder/decoder in comparison to conventional XOR-arithmetic.

Figure 4:
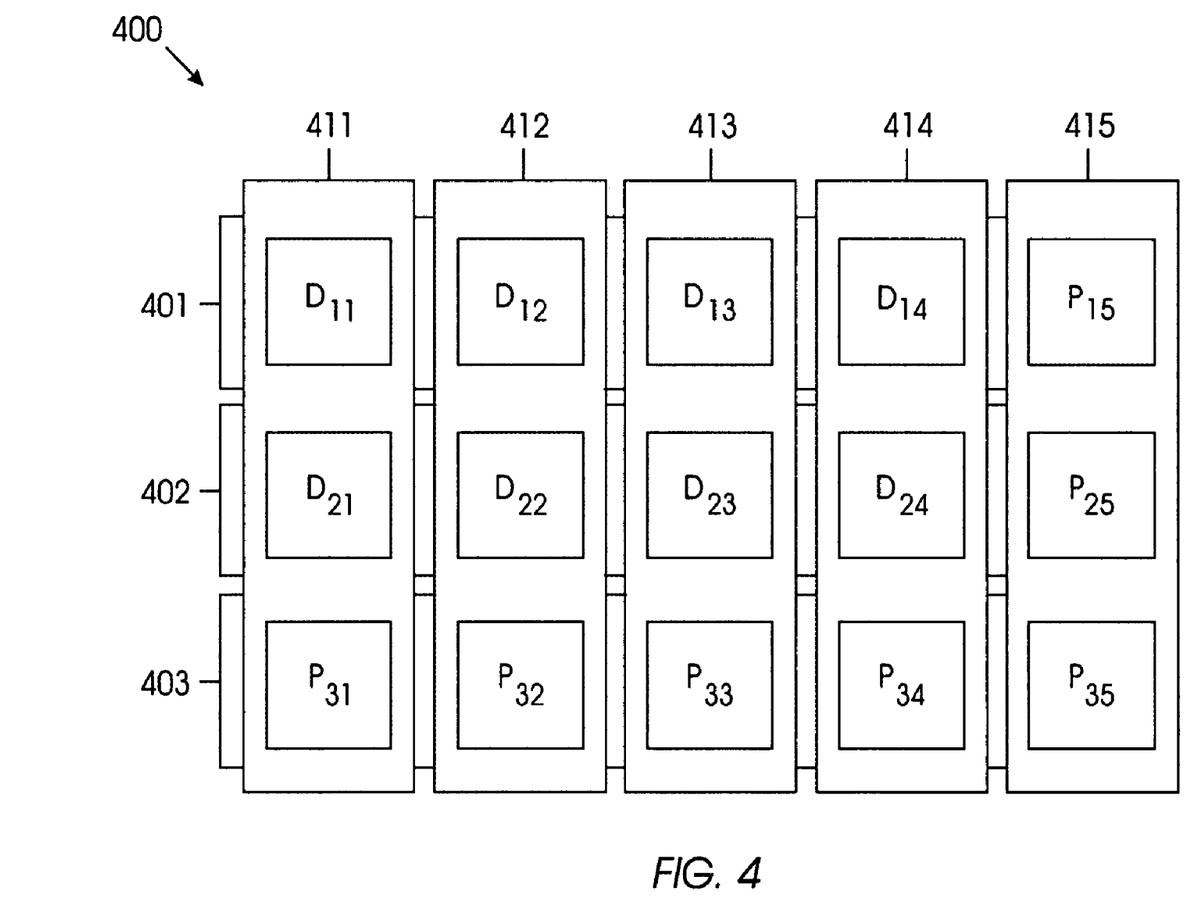
FIG. 4 shows an exemplary 3×5 array of HDDs for illustrating the basic concept of the present invention.

FIG. 4 shows an exemplary 3×5 array 400 of HDDs for illustrating the basic concept of the present invention. If array 400 is arranged as the product of two parity codes, the product-check matrix would be of rank 5 and array 400 would have a Hamming distance of d=4. If array 400 is arranged according to the present invention, the product check matrix would be of rank 6 and array 400 would also have a Hamming distance of d=4. Array 400 would, however, tolerate more combinations of four failures than would be the case for the product of two parity codes.

Array 400 includes nine HDDs arranged in three blades 401–413. Blade 401 includes HDDs $D_{11}$, $D_{12}$, $D_{13}$, $D_{14}$ and $P_5$, in which HDDs $D_{11}$, $D_{12}$, $D_{13}$, and $D_{14}$ store data and HDD $P_{15}$ stores parity information for blade 401. Blade 402 includes HDDs $D_{21}$, $D_{22}$, $D_{23}$, $D_{24}$ and $P_{25}$, in which HDDs $D_{21}$, $D_{22}$, $D_{23}$ and $D_{24}$ stores data and HDD $P_{25}$ stores parity information for blade 402. Blade 403 includes HDDs $P_{31}$, $P_{32}$, $P_{33}$, $P_{34}$ and $P_{35}$, in which HDD $P_{31}$ stores parity information for column 411, HDD $P_{32}$ stores parity information for column 412, HDD $P_{33}$ stores parity information for column 413, HDD $P_{34}$ stores parity information for column 414, and HDD $P_{35}$ stores parity information for column 415 and for blade 403.

According to the present invention, Equations 1–7 below are a system of linear check equations that are used for achieving a distance d=4, but having a higher failure tolerance than a product code of the same distance.

$$D_{11} \oplus D_{12} \oplus D_{13} \oplus D_{14} \oplus P_{15} = 0 \quad (1)$$

$$D_{21} \oplus D_{22} \oplus D_{23} \oplus D_{24} \oplus P_{25} = 0 \quad (2)$$

$$P_{31} \oplus P_{32} \oplus P_{33} \oplus P_{34} \oplus P_{35} = 0 \quad (3)$$

$$\alpha^6 D_{11} \oplus \alpha^3 D_{21} \oplus P_{31} = 0 \quad (4)$$

$$\alpha^4 D_{12} \oplus \alpha^2 D_{22} \oplus P_{32} = 0 \quad (5)$$

$$\alpha^2 D_{13} \oplus \alpha D_{23} \oplus P_{33} = 0 \quad (6)$$

$$D_{14} \oplus D_{24} \oplus P_{34} = 0 \quad (7)$$

The row equations, i.e., Eqs. 1–3, are based on simple parity, as in a product code or nested array. The four column equations, i.e., Eqs. 4–7, are based on a generalized parity code, and include the powers of a multiplier a that is used to break some of the degeneracy of the equations when a conventional XOR parity scheme were used.

Multiplier α is a generator of a finite field that has at least five (i.e., the number of columns) non-zero elements. So, α can be the generator of GF(8), that is, α satisfies the equation $\alpha^3 \oplus \alpha \oplus 1 = 0$, or α can be the generator of GF(16), that is, α satisfies the equation $\alpha^4 \oplus \alpha \oplus 1 = 0$.

This generalized product code has a minimum distance d=4, just as the basic product code. Thus, the generalized parity code, just as the basic product code, can be used for retrieving the information when three or fewer HDDs have failed.

The advantage of the generalized product code over the basic product code lies in the ability of the generalized product code to retrieve the information of failure patterns that the basic product code cannot. One such error pattern is illustrated in FIG. 3, which shows $D_{12}$, $D_{13}$, $D_{22}$, and $D_{23}$ as failed HDDs. This failure pattern cannot be corrected had the product code been used. With the generalized product code described above, Equations 1, 2, 5, and 6 can be used to correct the errors. In fact, any error pattern that the extended product code can correct without using the parity equation for column 415 can also be corrected by the generalized product code. Thus, 18 of the 30 four-failure error patterns that cannot be corrected by the basic product code are correctable by the generalized product code.

Figure 5:
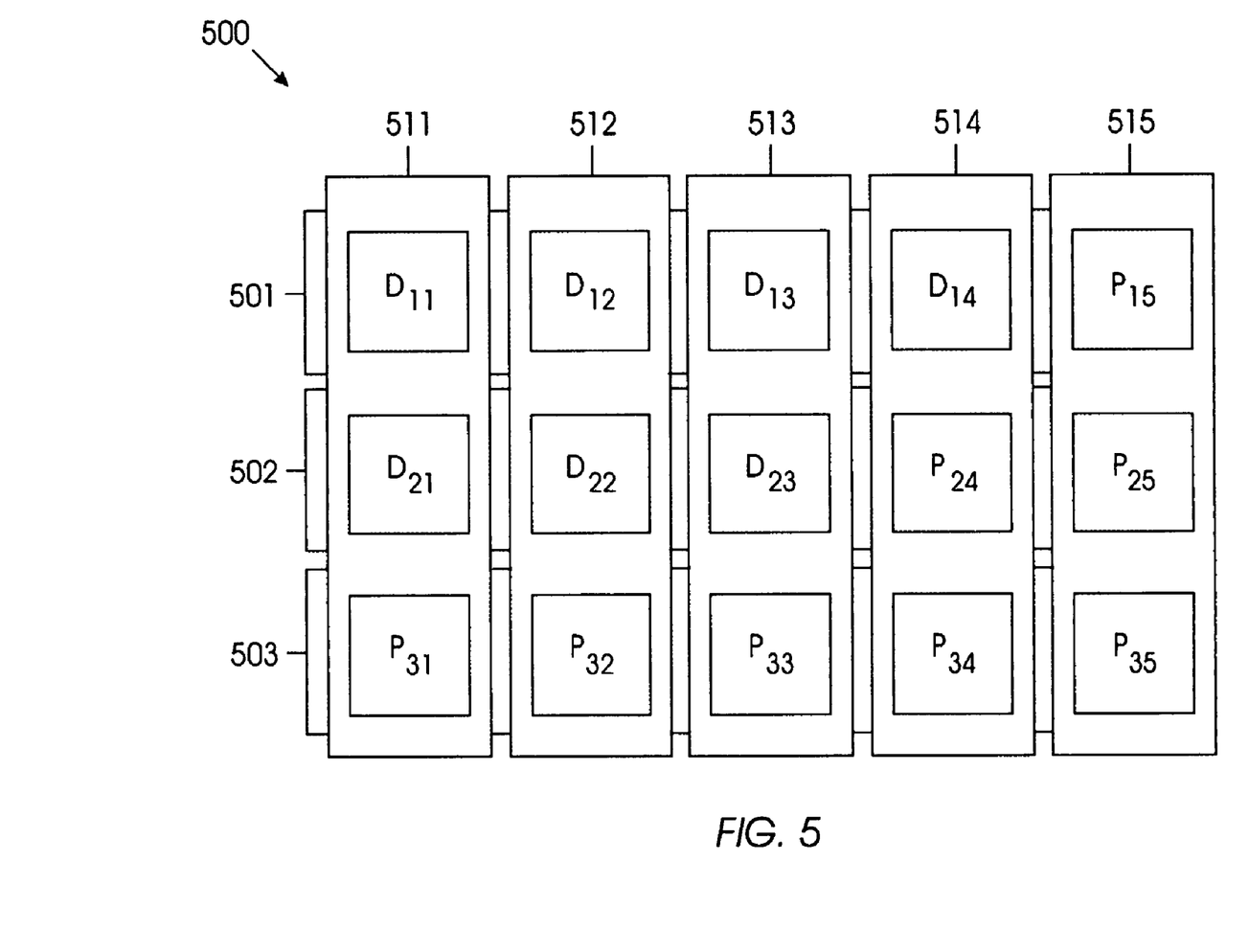
FIG. 5 shows an exemplary 3×5 array of HDDs for further illustrating the present invention.

To further illustrate the present invention, consider an exemplary array 500 of HDDs shown in FIG. 5 in contrast to arrangement 400 of FIG. 4. The arrangement of HDDs is the same as for array 400, with the exception of HDD $P_{24}$, which stores parity information about all the data.

According to the present invention, Equations 9–11 and 12–16 are the systems of linear equations that are used for determining the information in the parity HDDs so that the code has distance d=6.

$$D_{11} \oplus D_{12} \oplus D_{13} \oplus D_{14} \oplus P_{15} = 0 \quad (8)$$

$$D_{21} \oplus D_{22} \oplus D_{23} \oplus D_{24} \oplus P_{25} = 0 \quad (9)$$

$$P_{31} \oplus P_{32} \oplus P_{33} \oplus P_{34} \oplus P_{35} = 0 \quad (10)$$

$$\alpha^8 D_{11} \oplus \alpha^4 D_{21} \oplus P_{31} = 0 \quad (11)$$

$$\alpha^6 D_{12} \oplus \alpha^3 D_{22} \oplus P_{32} = 0 \quad (12)$$

$$\alpha^4 D_{13} \oplus \alpha^2 D_{23} \oplus P_{33} = 0 \quad (13)$$

$$\alpha^2 D_{14} \oplus \alpha P_{24} \oplus P_{34} = 0 \quad (14)$$

$$P_{15} \oplus P_{25} \oplus P_{35} = 0 \quad (15)$$

The row equations, Equations 8–10, are based on simple parity, as in a basic product code. The five column equations, Equations 11–15, are based on a generalized parity code, and include the powers of multiplier a that is used to break the degeneracy of the equations when a conventional XOR parity scheme is used.

Multiplier $\alpha$ is a generator of a finite field which has at least five (the number of columns) non-zero elements. So, $\alpha$ can be the generator of GF(8), that is, $\alpha$ satisfies the equation $\alpha^3 \oplus \alpha \oplus 1 = 0$, or $\alpha$ can be the generator of GF(16), that is, $\alpha$ satisfies the equation $\alpha^4 \oplus \alpha \oplus 1 = 0$.

It is a consequence of the Equations 8–15 that:

$$P_{24} = (\alpha+1)^{-1}[(\alpha^8 \oplus 1)D_{11} \oplus (\alpha^6 \oplus 1)D_{12} \oplus (\alpha^4 \oplus 1)D_{13} \oplus (\alpha^2 \oplus 1)D_{14} \oplus (\alpha^4 \oplus 1)D_{21} \oplus (\alpha^3 \oplus 1)D_{22} \oplus (\alpha^2 \oplus 1)D_{23}] \quad (16)$$

Figure 6A:
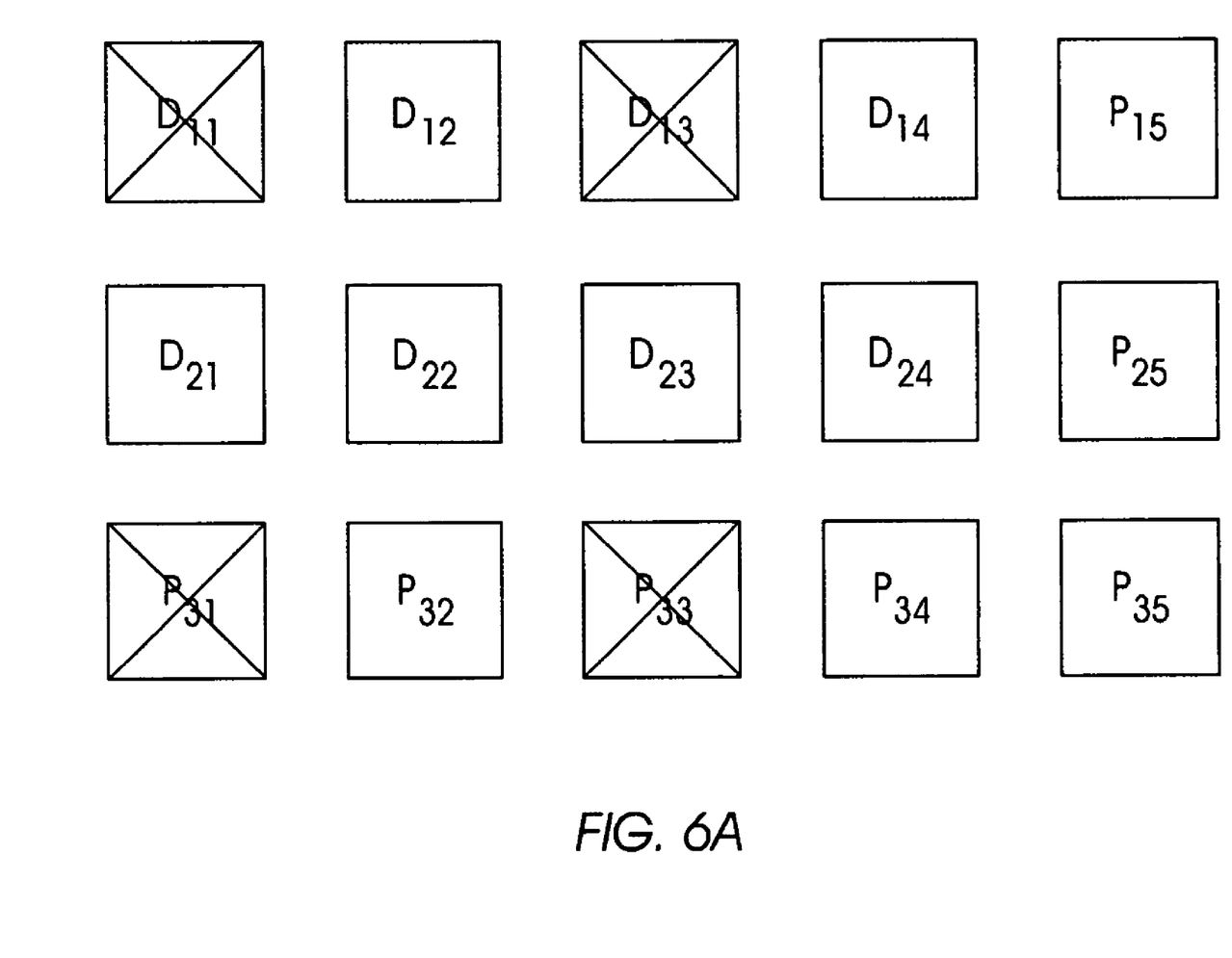
FIGS. 6a and 6b show an exemplary 3×5 array of HDDs having different combinations of HDD failures.

Equation 16 is used for determining the information in $P_{24}$, Then, Equation 8 is used for determining the information in $P_{15}$, Equation 9 is used for determining the information in $P_{25}$, Equation 10 (or Equation 15) is used for determining the information in $P_{35}$, Equation 11 is used for determining the information in $P_{31}$, Equation 12 is used for determining the information in $P_{32}$, Equation 13 is used for determining the information in $P_{33}$, and Equation 14 is used for determining the information in $P_{34}$. The power of the code is illustrated in FIG. 6a, which shows $D_{11}$, $D_{13}$, $P_{31}$, and $P_{33}$ as failed HDDs. This failure pattern cannot be corrected had the product code been used. With the code described above, Equations 8, 10, 11, and 13 can be used for recovering the information on the failed HDDs. Without multiplier $\alpha$, Equations 8, 10, 11 and 13 would have been degenerate, and could not be used for determining the information content of the failed HDDs.

Figure 6B:
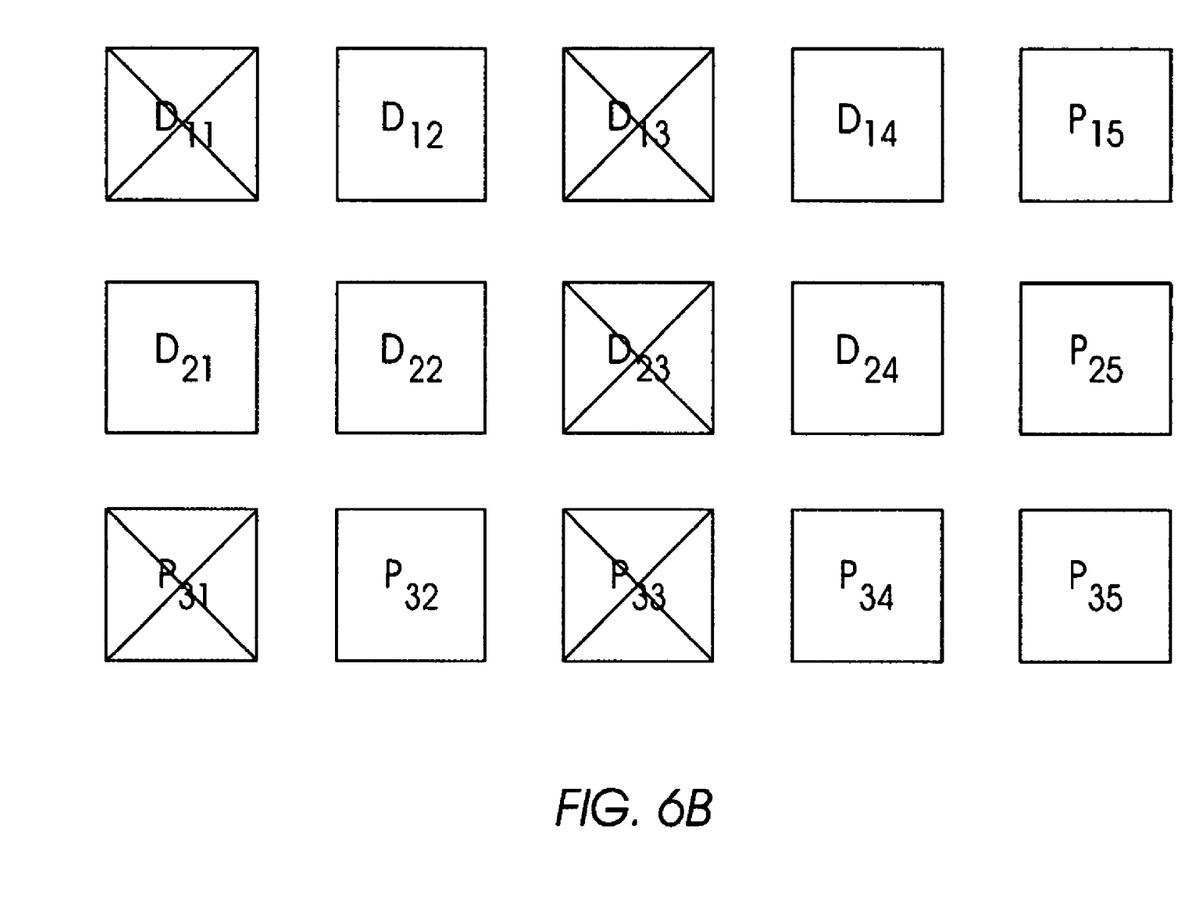

The power of the code is illustrated even further in FIG. 6b, which shows $D_{23}$ as a failed HDD, in addition to $D_{11}$, $D_{13}$, $P_{31}$, and $P_{33}$. Equation 9 can now be used to first to recover the information in $D_{23}$, and then Equations 8, 10, 11, and 13 can be used. It should be clear that any pattern of five or fewer failed HDDs can be corrected by this code, i.e. it has distance d=6.

Figure 7:
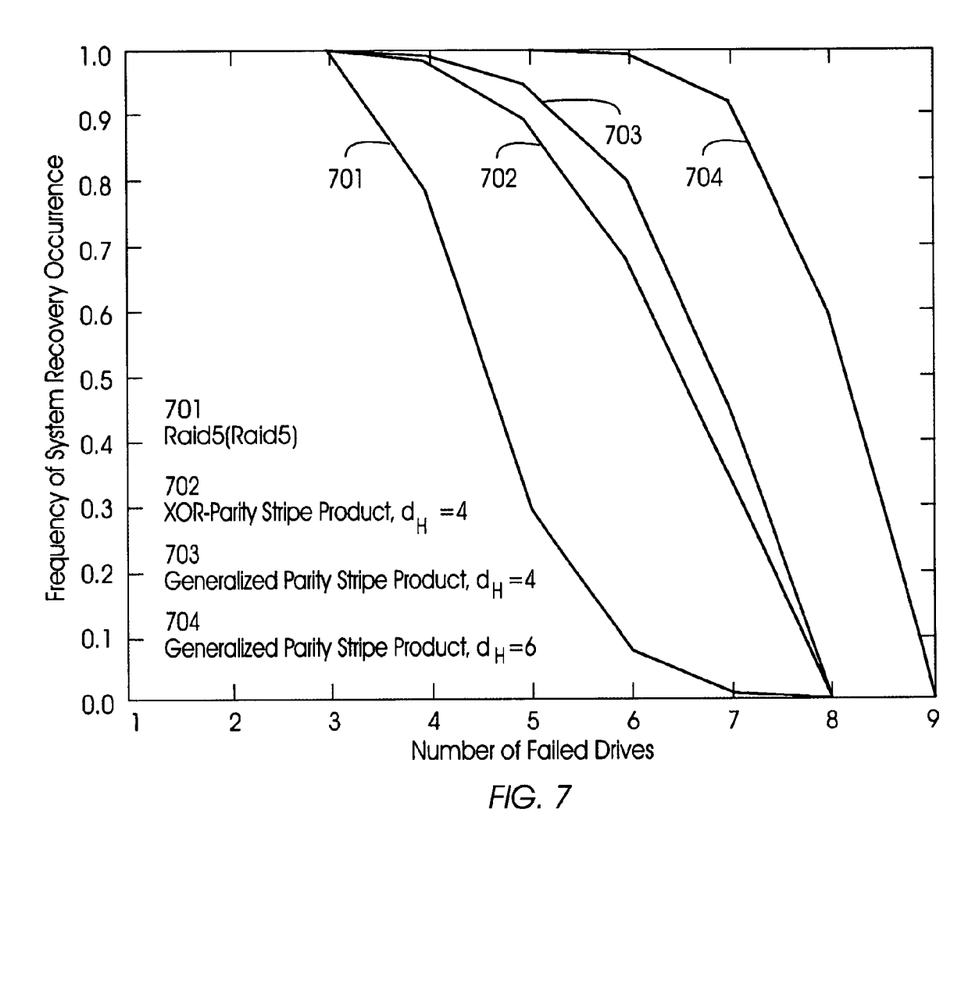
FIG. 7 is a graph showing a comparison of the failure tolerance for different array designs using a 3×5 array configuration generally shown in FIGS. 1, 4 and 5.

FIG. 7 is a graph 700 showing a comparison of the failure tolerance for different array designs using a 3×5 array configuration generally shown in FIGS. 1, 4 and 5. The abscissa of FIG. 7 is the number of failed disk drives. The ordinate of FIG. 7 is the frequency of system recovery occurrence, which is the probability of the system remaining functional. Curve 701 represents the probability of a nested RAID 5 remaining functional as a function of the number of failed disk drives. Curve 702 represents the probability of a d=4 product code remaining functional as a function of the number of failed disk drives. Curve 703 represents the probability of a d=4 generalized parity product code according to the present invention (array 400 in FIG. 4) remaining functional as a function of the number of failed disk drives. Curve 704 represents the probability of a d=6 orthogonal parity product code according to the present invention (array 500 in FIG. 5) remaining functional as a function of the number of failed disk drives.

While all the d=4 code configurations (curves 702 and 703) begin to allow failure at the loss of four HDDs, the product codes are much more likely to tolerate further failures than the nested code configuration (curve 701). The orthogonal parity codes of the present invention (curve 704) are the strongest, with the d=6 being the best. In general, the failure tolerance can be characterized by comparing the number of drive failures at a given probability of system failure, or by comparing the probability of system failure at a given number of failed drives.

Considering failure tolerance based on the number of drive failures at a 90% probability of system recovery, the product code (curve 702) tolerates about 1.4 more disk drive failures than the nested code configuration (curve 701). The d=4 generalized code (curve 703) tolerates about 1.9 more disk drive failures than the nested code configuration. The d=6 code (curve 704) tolerates about 3.5 more disk drive failures than the nested code configuration (curve 701). Considering failure tolerance based on the probability of system failure for 6 disk drive failures, the probability of system recovery using the nested code configuration (curve 701) is 8%, while the product code configuration is 67%. The probability of system failure for six disk drives for the d=4 general code configuration is 79% and is 98% for the d=6 code configuration (curve 704).

Accordingly, the orthogonal parity codes according to the present invention require substantially less field service and, thus, have substantially lower warranty codes than the nested or prior-art code implementations.

Figure 8:
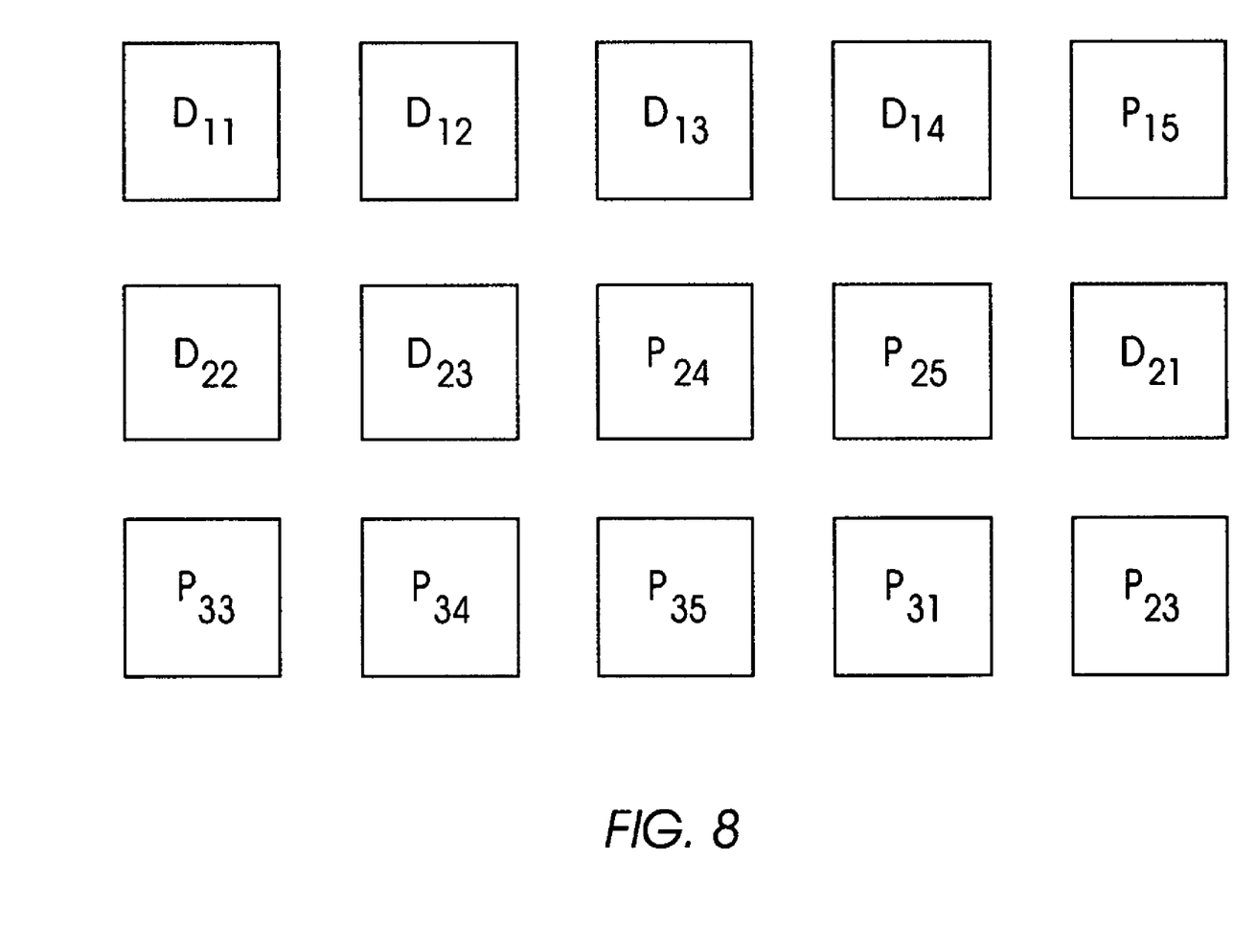
FIG. 8 shows an exemplary 3×5 array of HDDs for further illustrating the present invention.

The above description has described the invention using an orthogonal arrangement of parity lines arranged as rows and columns. It should be clear that any orthogonal set of parity lines may be used, such that any line from one set has only one intersection with any single line from the other set. For example, the vertical (column) lines could be replaced by diagonal lines, as shown in FIG. 8. Here, the HDDs have been relabeled to show the diagonal arrangement, such that the representations in Equations 8–15 can still be used. It can be seen that Equations 11–15 now represent diagonal lines through the array. For example, Equation 15 goes down the diagonal including $P_{15}$, $P_{25}$ and $P_{35}$, while Equation 11 goes down the wrapped diagonal including $D_{11}$, $D_{21}$ and $P_{31}$.

Even though the present invention has been described in terms of storage arrays formed from HDD storage units, the present invention is applicable to storage systems formed from arrays of other memory devices, such as Random Access Memory (RAM) storage devices, optical storage device, and tape storage devices. Additionally, it is suitable to virtualized storage systems, such as arrays built out of network-attached storage.

Although the foregoing invention has been described in some detail for purposes of clarity of understanding, it will be apparent that certain changes and modifications may be practiced that are within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A storage system, comprising a plurality of storage devices arranged in an array having M rows and N columns, M being greater than or equal to three and N being greater than or equal to three, the array having a Hamming distance of d when P of the storage devices are configured as parity storage devices and (M×N)−P of the storage devices are configured as data storage devices, the array having a Hamming distance of d+1 when P+1 of the storage devices are configured as parity storage devices and (M×N)−(P+1) of the storage devices are configured as data storage devices, the array being configured with P+1 of the storage devices as parity storage devices and (M×N)−(P+1) of the storage devices as data storage devices, and information contained in the parity storage devices being determined based on a system parity and the linear equations based on the N rows being based on a generalized parity code.

2. The storage system according to claim 1, wherein P=M+N−1.

3. A method of increasing the Hamming distance of an array of storage devices having M rows and N columns, M being greater than or equal to three and N being greater than or equal to three, the method comprising steps of:
  forming the M×N array by
    forming a first predetermined number of rows of the array to each have a second predetermined number of data storage devices and a third predetermined number of parity storage devices, the third predetermined number being greater than or equal to one, and
    forming M minus the first predetermined number of rows of the array to have N parity storage devices;
  increasing a number of parity devices in the M×N array by changing a selected data storage device in one of the first predetermined number of rows to be a parity storage device.

4. A method of recovering data stored on a failed storage device in an array of storage devices having M rows and N columns, M being greater than or equal to three and N being greater than or equal to three, a first predetermined number of rows of the array each having a second predetermined number of data storage devices and a third predetermined number parity storage devices, the third predetermined number being greater than or equal to one, one of the rows of the array having the second predetermined number minus one data storage devices and the third predetermined number plus one parity storage devices, a fourth predetermined number of rows of the array having N parity storage devices, the first predetermined number plus the fourth predetermined number plus one equaling M, and the second predetermined number plus the third predetermined number equaling N, the method comprising steps of:
  forming a plurality of row equations that are based on parity;
  forming a plurality of column equations that are based on an orthogonal parity code and includes a higher-order multiplier that changes each column, the higher order multiplier selected to generate a finite basic field of N elements; and
  recovering the data stored on the failed storage device based on the row equations and the column equations.

5. The method according to claim 4, wherein the third predetermined number equals one, and
  wherein the step of forming a plurality of row equations is based on simple parity.

6. A method of recovering data stored on a failed storage device in an array of storage devices having M rows and N columns, M being greater than or equal to three and N being greater than or equal to three, a first predetermined number of rows of the array each having a second predetermined number of data storage devices and a third predetermined number parity storage devices, the third predetermined number being greater than or equal to one, a fourth predetermined number of rows the array having N parity storage devices, the method comprising steps of:
  forming a plurality of row equations that are based on parity;
  forming a plurality of column equations that are based on an orthogonal parity code and includes a higher-order multiplier that changes each column, the higher order multiplier selected to generate a finite basic field of N of elements; and
  recovering the data stored on the failed storage device based on the row equations and the column equations.

7. The method according to claim 6, wherein the third predetermined number equals one, and
  wherein the step of forming a plurality of row equations is based on simple parity.

8. The method according to claim 6, wherein the array has M+N−1 parity storage devices.

* * * * *